United States Patent
Neal et al.

(10) Patent No.: US 10,661,297 B2
(45) Date of Patent: May 26, 2020

(54) METHODS FOR VAPOR DEPOSITION

(71) Applicant: United Technologies Corporation, Farmington, CT (US)

(72) Inventors: James W. Neal, New Britain, CT (US); Kevin W. Schlichting, South Glastonbury, CT (US); Brian T. Hazel, Avon, CT (US); David A. Litton, West Hartford, CT (US); Eric Jorzik, Annville, PA (US); Michael J. Maloney, Marlborough, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 16/032,803

(22) Filed: Jul. 11, 2018

(65) Prior Publication Data

US 2018/0318866 A1    Nov. 8, 2018

Related U.S. Application Data

(63) Continuation of application No. 15/006,900, filed on Jan. 26, 2016, now abandoned.

(Continued)

(51) Int. Cl.
  *C23C 14/24*   (2006.01)
  *B05B 15/62*   (2018.01)
  *C23C 14/50*   (2006.01)

(52) U.S. Cl.
  CPC ............ *B05B 15/62* (2018.02); *C23C 14/24* (2013.01); *C23C 14/243* (2013.01); *C23C 14/505* (2013.01)

(58) Field of Classification Search
  CPC .................................................. C23C 16/243
  See application file for complete search history.

(56) References Cited

U.S. PATENT DOCUMENTS

| 2,693,521 A | 11/1954 | Alexander |
| 3,670,089 A | 6/1972 | Paton et al. |

(Continued)

FOREIGN PATENT DOCUMENTS

| DE | 102004006849 A1 | 9/2005 |
| EP | 0972853 A1 | 1/2000 |

(Continued)

OTHER PUBLICATIONS

Extended European Search Report for EP Application No. 16199958.6, dated Feb. 20, 2017, 6 pages.

(Continued)

*Primary Examiner* — Joseph A Miller, Jr.
(74) *Attorney, Agent, or Firm* — Kinney & Lange, P.A.

(57) ABSTRACT

An embodiment of a method includes retaining a first workpiece and a second workpiece selectively on a workpiece fixture disposed within a deposition chamber. The workpiece fixture includes tooling including a first workpiece holder, a second workpiece holder, and a first hollow wall. The first workpiece is separated from the second workpiece using the first hollow wall. Energy is selectively applied and directed within the deposition chamber, from an energy source toward a first crucible, the first crucible including a plurality of walls defining an upper recess contiguous with, and disposed directly above a first lower recess, at least the upper recess open to an interior of the deposition chamber. During the step of selectively applying and directing energy, a gas valve is controlled to maintain a partial vacuum in the deposition chamber of greater than 2 Pa to control a size and overlap of at least one coating zone formed around each of the at least one workpiece.

9 Claims, 8 Drawing Sheets

Related U.S. Application Data

(60) Provisional application No. 62/258,892, filed on Nov. 23, 2015.

(56) References Cited

U.S. PATENT DOCUMENTS

| | | | |
|---|---|---|---|
| 4,110,893 | A | 9/1978 | Elam et al. |
| 4,192,253 | A | 3/1980 | Richert et al. |
| 4,237,148 | A | 12/1980 | Richert et al. |
| 5,087,477 | A | 2/1992 | Giggins, Jr. et al. |
| 5,785,763 | A | 7/1998 | Onda et al. |
| 6,007,880 | A * | 12/1999 | Maloney ............... C23C 14/083 427/585 |
| 6,589,351 | B1 | 7/2003 | Bruce et al. |
| 7,166,168 | B1 | 1/2007 | Heller et al. |
| 8,084,086 | B2 | 12/2011 | Hass et al. |
| 2003/0203127 | A1 | 10/2003 | Bruce et al. |
| 2004/0134430 | A1 | 7/2004 | Hass et al. |
| 2007/0240636 | A1* | 10/2007 | Gottsman ............... C23C 14/24 118/50 |
| 2009/0017205 | A1 | 1/2009 | Livings et al. |
| 2010/0068417 | A1 | 3/2010 | Neal et al. |
| 2011/0223353 | A1 | 9/2011 | Neal et al. |
| 2012/0282402 | A1 | 11/2012 | Neal et al. |
| 2013/0340679 | A1 | 12/2013 | Miyagawa et al. |

FOREIGN PATENT DOCUMENTS

| | | |
|---|---|---|
| JP | S51151684 A | 12/1976 |
| JP | H08315359 A | 11/1996 |
| JP | 2002371353 A | 12/2002 |
| WO | WO2014144189 A1 | 9/2014 |

OTHER PUBLICATIONS

Extended European Search Report for EP Application No. 16200137.4, dated Feb. 21, 2017, 6 pages.

B. Zimmermann, G. Mattausch, B. Scheffel, J.-P. Heinss, F.-H Rögner, C. Metzner; "Plasma-Based Tools for Activated EB-PVD of TBC Systems", from Fraunhofer Institute for Electron Beam and Plasma Technology, Jun. 2014, 1 page.

B. Zimmermann, F. Fietzke, G. Mattausch; "Hollow Cathode Arc Enhancement in Reactive PVD Processes", from Fraunhofer Institute for Electron Beam and Plasma Technology, Jun. 2013, 1 page.

European Office Action from EP Application No. 16199958.6, dated Jul. 31, 2018, 5 pages.

\* cited by examiner

METHODS FOR VAPOR DEPOSITION

CROSS-REFERENCE TO RELATED APPLICATION(S)

This application is a continuation of U.S. Nonprovisional application Ser. No. 15/006,900 filed on Jan. 26, 2016, which in turn claims the benefit of U.S. Provisional Application No. 62/258,892 filed Nov. 23, 2015 for "TOOLING, CRUCIBLE, AND FEEDSTOCK FOR VAPOR DEPOSITION" by James W. Neal, Kevin W. Schlichting, Brian T. Hazel, David A. Litton, Eric Jorzik, and Michael J. Maloney.

BACKGROUND

The disclosure relates generally to coating apparatus and methods, and more specifically to physical vapor deposition.

Electron Beam Physical Vapor Deposition (EB-PVD) processes and apparatus utilize a cloud of vaporized material which is solidified upon at least one workpiece surface in a deposition chamber. Vaporized material for deposition can be generated by energizing feedstock material which can be retained in a conductive crucible.

Despite efforts at identifying favorable coating parameters, there are frequently issues around the edges of vapor clouds and with uniformly exposing surfaces of certain irregularly shaped workpieces to the vapor plume(s). Coating multiple workpieces in a chamber increases the risk of irregular or uneven application due to overlapping vapor plumes from multiple feedstocks distributed through the chamber.

SUMMARY

An embodiment of a method includes retaining a first workpiece and a second workpiece selectively on a workpiece fixture disposed within a deposition chamber. The workpiece fixture includes tooling including a first workpiece holder, a second workpiece holder, and a first hollow wall. The first workpiece is separated from the second workpiece using the first hollow wall. Energy is selectively applied and directed within the deposition chamber, from an energy source toward a first crucible, the first crucible including a plurality of walls defining an upper recess contiguous with, and disposed directly above a first lower recess, at least the upper recess open to an interior of the deposition chamber. During the step of selectively applying and directing energy, a gas valve is controlled to maintain a partial vacuum in the deposition chamber of greater than 2 Pa to control a size and overlap of at least one coating zone formed around each of the at least one workpiece.

DETAILED DESCRIPTION

Electron Beam Physical Vapor Deposition (EB-PVD) processes and apparatus utilize a cloud of vaporized material which is solidified on one or more workpieces in a chamber. Particularly but not exclusively for multiple and/or complex workpieces, tooling such as shields or boxes around a workpiece allows for substantially uniform coating of each workpiece by optimizing heating of each workpiece and preventing overlap of multiple vapor clouds or plumes, each of which can be dedicated to one or more workpieces. Crucibles, which retain coating feedstock, can be configured with various features and can work in conjunction with, or independently of, the tooling to improve coating of multiple and/or complex workpieces.

Figure 1:
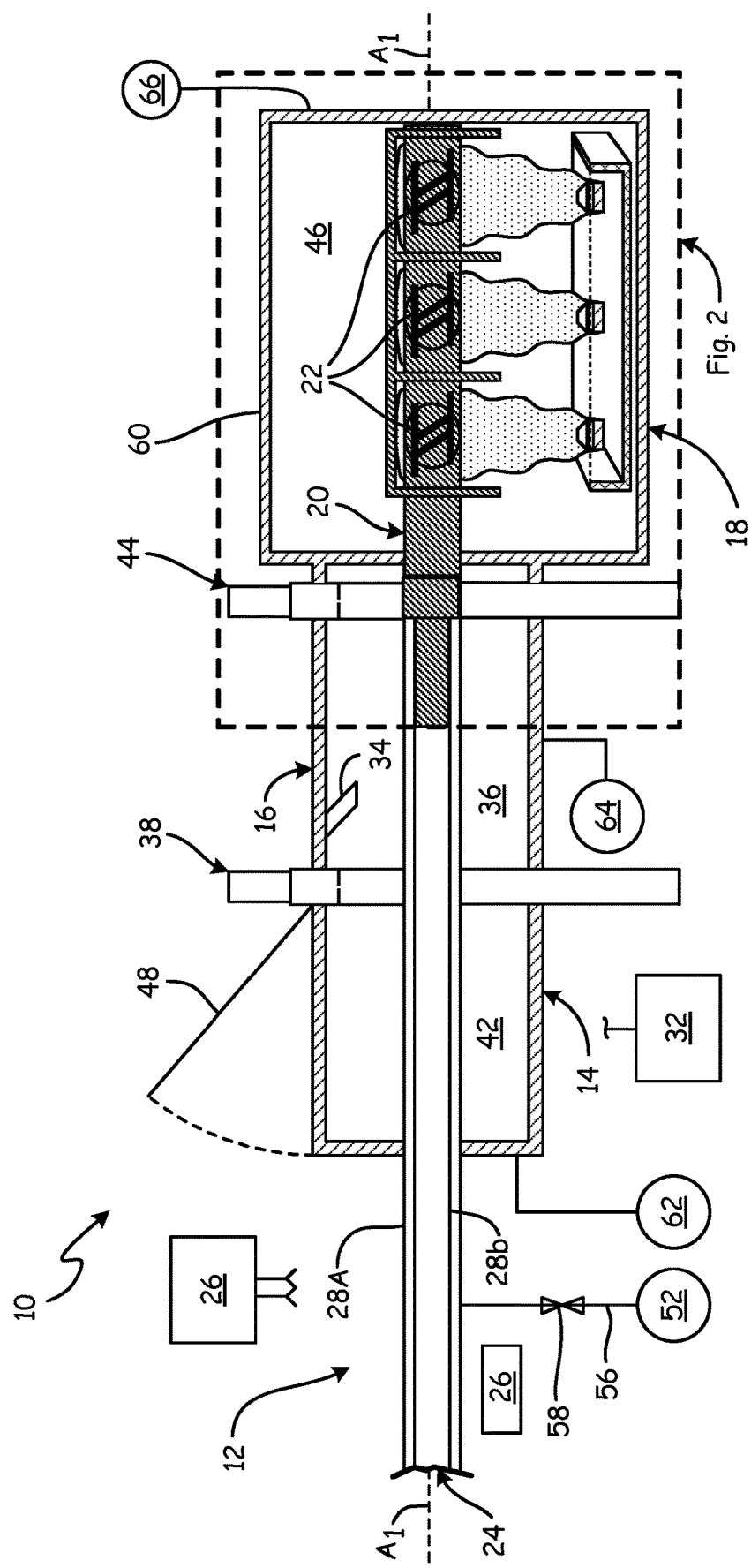
FIG. 1 is a schematic cross-sectional view of an example coating apparatus.

FIG. 1 shows a non-limiting example embodiment of a coating apparatus/system (coater) 10, which generally includes carrier and drive system 12, loading station or chamber 14, optional preheat chamber 16, and deposition chamber 18. The example carrier and drive system 12 can include one or more workpiece fixtures 20 holding workpieces 22 at one end of a sting assembly (sting) 24. While only one fixture 20 is shown, there can be more than one fixture 20 each carrying workpieces 22 in an associated group of workpieces.

There are numerous ways to move workpieces into, out of, and around deposition chamber 18, only one non-limiting example of which is shown in FIG. 1. Drive mechanism (e.g., an actuator) 26 can be operable to drive sting assembly 24 in one or more directions. For example, sting 24 can include inner member 28B partially concentrically within outer member 28A. Drive mechanism 26 can be mounted to outer member 28A to longitudinally shift outer member 28A (and thereby inner member 28B). Drive mechanism 26 can also rotate inner member 28B relative to outer member 28A about axis $A_1$.

In this non-limiting example, drive mechanism 26 can have a screw drive mechanism (e.g., electric motor driven) or other suitable construction for longitudinally shifting sting 24 and fixture 20 in associated loading station or chamber 14. Additionally or alternatively, drive mechanism 26 can be part of a robotic system tailored for automated loading and unloading of workpieces 22 into the various chambers 14, 16, 18. One or more workpiece holders (shown in FIGS. 2 and 3) can be mounted at an end of inner member 28B closest to, or within deposition chamber 18, depending on the position of sting 24.

Each fixture 20 can include components which are rotatable about at least one longitudinal axis (e.g., longitudinal horizontal axis $A_1$) in response to various manual or automated commands. A control system 32 can include an appropriately configured microcomputer, microcontroller, or other controller being configured by software and/or hardware to perform the functions described herein, among others not explicitly described. Control system 32 can be in communication (wired and/or wirelessly) to various controllable system components as well as to sensors, input devices for receiving user input, and display devices (not shown for clarity).

For preheating workpieces 22, coating system 10 can include an optional preheat chamber 16, with workpiece preheater 34, positioned on a side of deposition chamber 18. Preheater 34 can be any suitable thermal device capable of providing heating such as conductive or radiative heating. Preheater 34 can additionally or alternatively include electron beam guns directed to interior 36. In embodiments omitting preheater 34, chamber 16, between loading chamber 14 and deposition chamber 18, can additionally or alternatively serve as a transfer chamber for staging or other interim processing and preparation steps.

First gate valve 38 can be positioned at one end of preheat chamber 16, i.e., between interior 36 of preheat chamber 16 and interior 42 of loading chamber 14. Second gate valve 44 can be disposed at an opposing end of preheat chamber 16. Second gate valve 44 would thus be between interior 36 of preheat chamber 16 and interior 46 of deposition chamber 18. Each of the valves 38, 44 can additionally or alternatively be replaced by two or more valves so as to allow further isolation of chambers 14, 16, 18 or to allow various alternative couplings of multiple loading chambers 14, preheat chambers 16, and/or deposition chambers 18.

Figure 2:
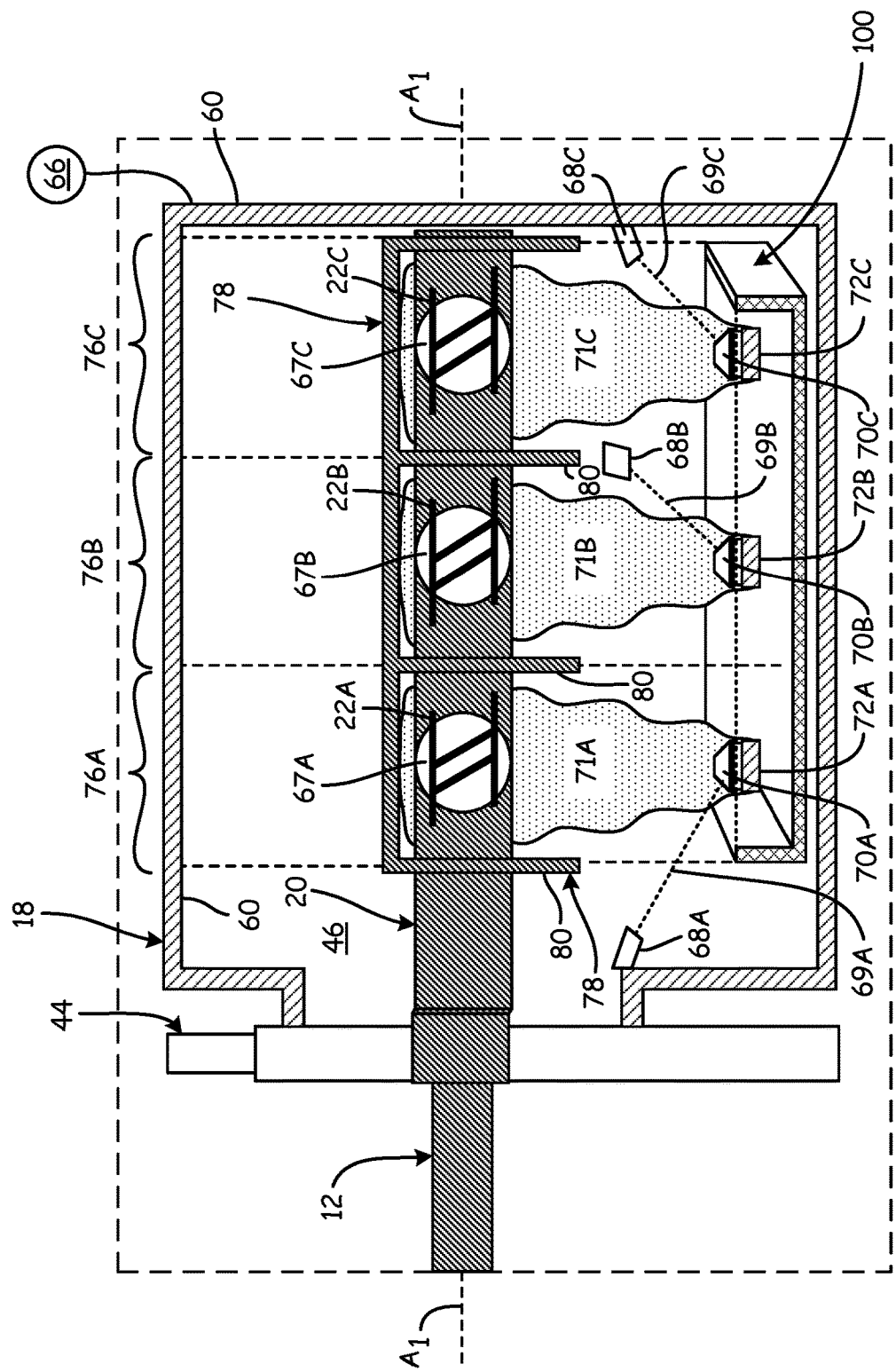
FIG. 2 is a detailed view of a deposition chamber portion of the example coating apparatus and tooling in use.

Loading chamber 14 can have one or more loading doors 48 and a loading drive system/mechanism (not visible in FIG. 1). For purposes of schematic illustration, door 48 is shown in FIG. 1 as being positioned to close an opening or port at the top of loading chamber 14. However, such door(s) 48 can additionally or alternatively be positioned at one or both sides of chamber 14, or below. When the appropriate gate valves 38, 44 are open, a loading drive system/mechanism can shift workpieces 22 into preheat chamber 16, or all the way into deposition chamber 18. The loading mechanism can be a part of carrier/drive system 12, or can include independent actuator(s) or controls. For purposes of deposition, one or more electron guns or other energy source can be positioned at or within deposition chamber 18 to each direct an associated energy beam to feedstock material. As shown in FIG. 2, the feedstock material can include ingots or other masses of ceramic-forming material each in an associated crucible.

For introducing a reactive gas (e.g., oxygen for combining with the initially vaporized material in the vapor clouds to make up for oxygen lost from the evaporated ceramic) a gas source 52 can be provided. One example of a reactive gas can be essentially pure oxygen. The gas source 52 can be connected to an outlet (e.g., a manifold in deposition chamber 18, omitted for clarity) via a gas line 56 and controlled by a gas valve 58. Line 56 can be connected to one or more extensions through sting 24 to an outlet/manifold in deposition chamber 18, or can be routed differently to provide reactive gas if and when it is needed for deposition.

Coating chamber 18 can include at least one vacuum port 66 (having one or more pumps with associated conduits and valves, omitted for clarity) through one of a plurality of chamber walls 60. In certain embodiments, such as the example shown in FIG. 1, first, second, and third vacuum ports 62, 64, 66 can be associated with respective chambers 14, 16, 18.

Figure 3:
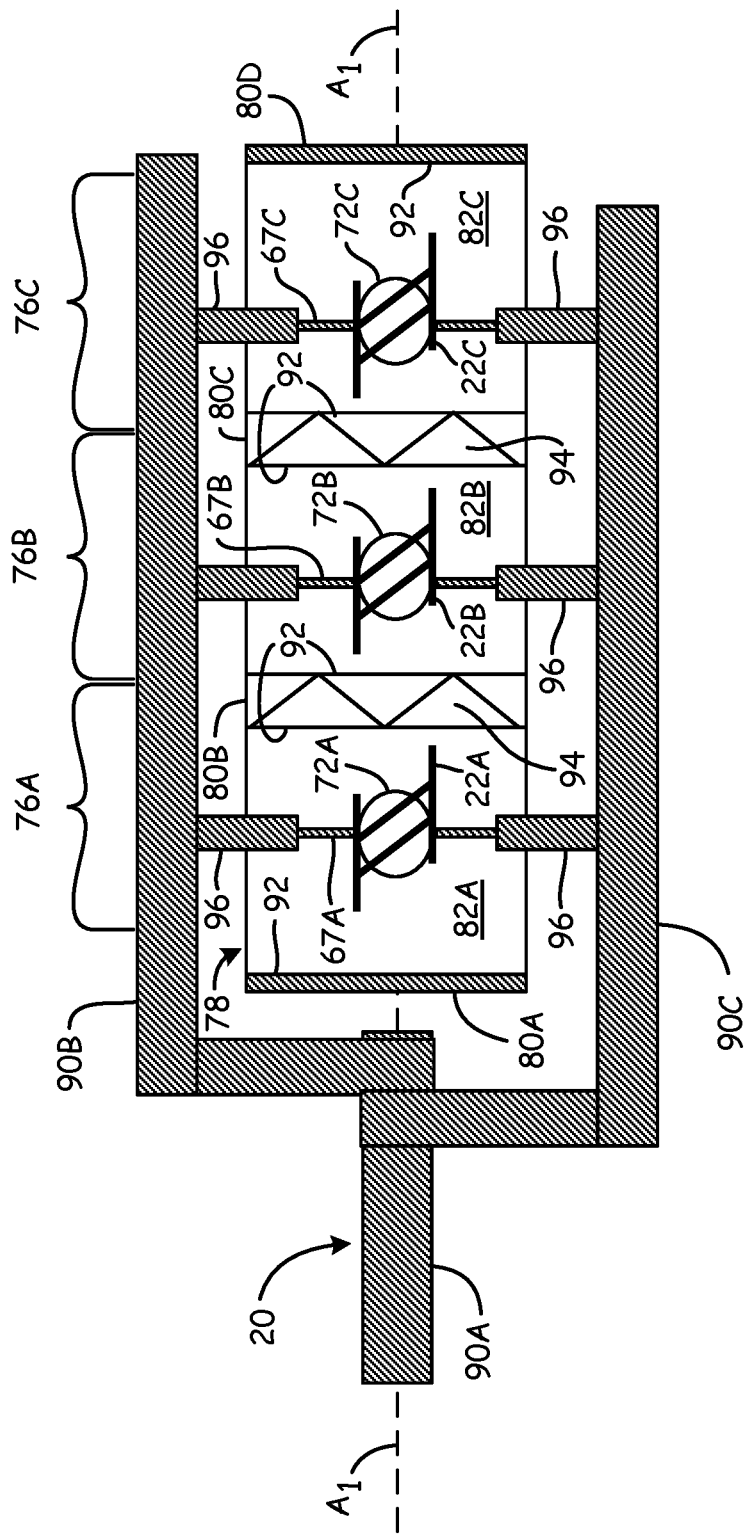
FIG. 3 shows a top view of a workpiece fixture for use in a deposition chamber.

FIG. 2 shows a detailed view of deposition chamber 18 with the apparatus in use, as indicated by the dashed line labeled 'FIG. 2' in FIG. 1. Fixture 20 can include at least a first workpiece holder 67A configured to retain at least first workpiece 22A in deposition chamber 18. Here, second workpiece holder 67B is configured to retain second workpiece 22B and third workpiece holder 67C is configured to retain second workpiece 22C. Fixture 20 can include one or more motorized or actuated arms to rotate workpiece(s) 22A, 22B, 22C about at least longitudinal axis $A_1$. FIG. 3 shows a different view of fixture 20 in the form of a triaxial shaft.

FIG. 2 also shows crucibles 72A, 72B, 72C, at or near the base of deposition chamber 18, which are configured to retain feedstock material (e.g., from feedstock ingots) 70A, 70B, 70C therein. Energy sources 68A, 68B, 68C (e.g., electron beam guns) direct vaporization energy 69A, 69B, 69C toward crucibles 72A, 72B, 72C for energizing any coating feedstock retained therein and generating corresponding vapor clouds or plumes 71A, 71B, 71C. Feedstock material 70A, 70B, 70C can either be of similar form to a desired coating material, or it can be a precursor combinable with a carrier of mixing gas (e.g., oxygen) to form a desired chemistry under system operating conditions.

Figure 4:
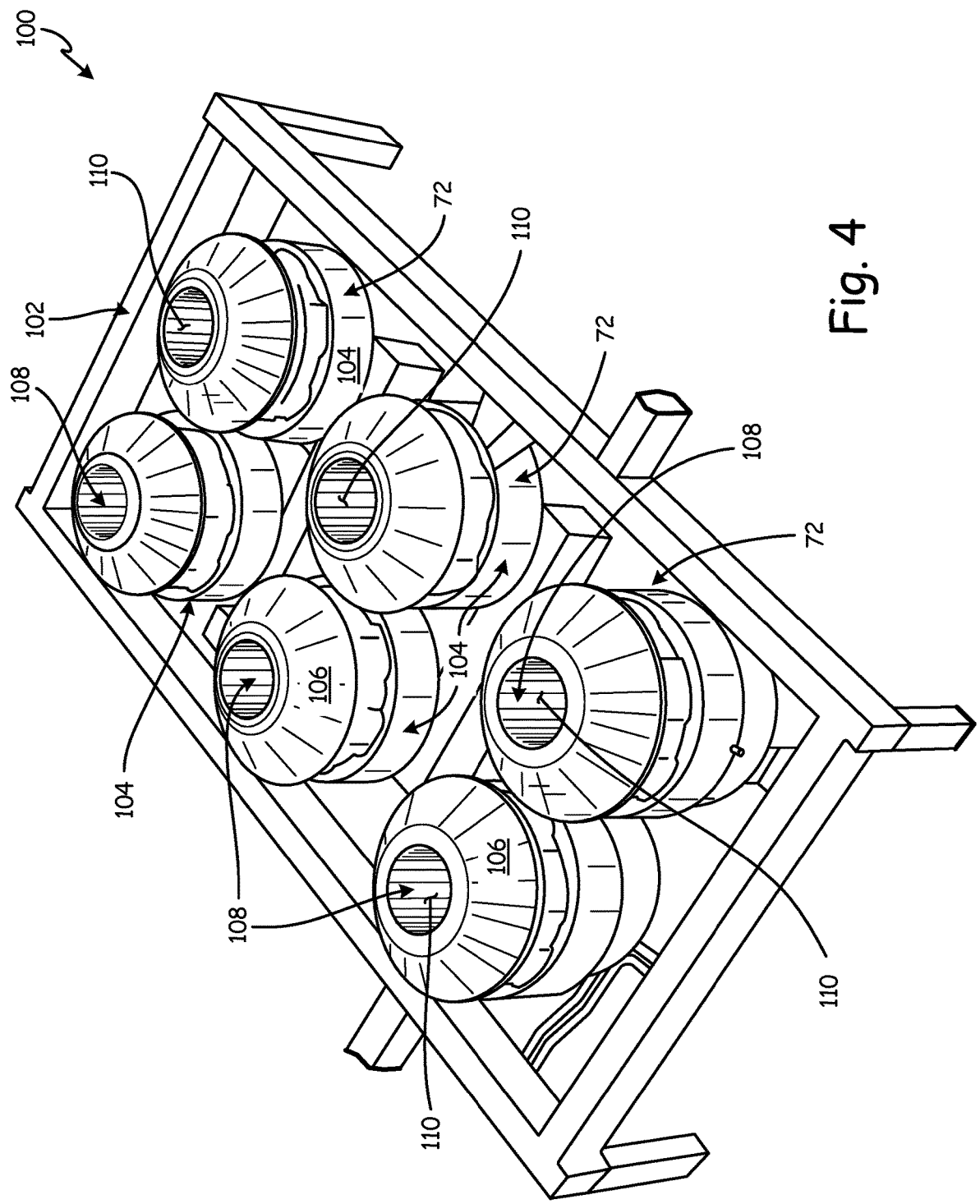
FIG. 4 shows an arrangement of crucibles in a magazine for processing through the apparatus.

In certain embodiments, one or more crucibles 72 (e.g., crucibles 72A, 72B, 72C) can be translated within deposition chamber 18 via magazine 100 (shown in more detail in FIG. 4). Magazine 100 can be configured, for example, to align feedstock material 70A, 70B, 70C and resulting plumes 71A, 71B, 71C with corresponding coating zones 76A, 76B, 76C with minimal overlap. Magazine 100 can also retain crucibles 72 in any other suitable configuration relative to one or more coating zones and/or workpieces.

Also shown in FIG. 4, crucibles 72 can each include an inert body 106 including one or more walls 110 defining recesses 108 for retaining feedstock. The recesses are open to deposition chamber 18 to allow vapor plumes resulting from energizing feedstock to flow toward the workpiece(s). Subsequent figures also show how the shape of the recesses can result in differently contoured vapor plumes for differently shaped workpieces.

Returning to FIG. 2, one or more coating zones can be formed within deposition chamber 18. In the example shown, tooling 78, such as baffles 80, can be provided to retain and separate workpieces 22A, 22B, 22C in individual first, second, and third coating zones 76A, 76B, 76C within deposition chamber interior 46. Tooling 78 can help confine vapor plumes into well-defined, physically separated coating zones so that each respective plume 71A, 71B, 71C can be in selective or constant communication with respective coating zones 76A, 76B, 76C.

Tooling 78 can be configured to allow for more predictable and uniform coating of multiple workpieces in a single coating run, particularly when less vacuum is applied causing higher pressures in the deposition chamber during coating. As is known in the art, a number of physical deposition processes, such as EB-PVD, are performed under significant vacuum, typically at pressures at or less than 2 Pa. Typically, lower pressures (i.e., increased vacuum) within deposition chamber 18 can provide higher energy states for the vaporized feedstock, facilitating deposition onto and adherence with a workpiece.

However, lower pressures in physical deposition processes result in larger and more dispersed vapor clouds or plumes, increasing the likelihood of overlapping clouds when attempting to coat multiple workpieces or attempting to coat elongated workpieces with multiple coating regions such as vane doublets and triplets. Further, larger vapor clouds or plumes may in some instances be prone to causing irregular coating around the perimeter of the vapor cloud, resulting in irregular deposition thickness if the workpiece is located near these perimeters. In such a case, tooling 78 can help ensure the workpieces are located away from the plume perimeters. In other instances of lower vapor pressure, however, overlapping vapor plumes produce fewer issues because the average number of collisions between vapor molecules is low enough that a single vapor cloud actually improves uniformity. At the same time, tooling 78 can improve radiative heating of the workpiece even in lower pressure (higher vacuum) coating conditions by reflecting energy back to the workpiece.

The same energy sources 68A, 68B, 68C that vaporize the feedstock material can be used to heat deposition chamber 18 (e.g., by directing their beams to a bed of refractory ceramic gravel, omitted for clarity). This can provide a preheating of the deposition chamber 18 (e.g., both before any coating runs and between coating runs).

FIG. 3 shows a more detailed view of fixture 20. Here, fixture 20 is a triaxial shaft fixture having a plurality of workpiece holders, e.g., workpiece holders 67A, 67B, 67C. Here, first arm 90A, second arm 90B, and third arm 90C are rotatable about axis $A_1$. This multishaft arrangement can ensure uniform exposure of different workpiece surfaces to the respective vapor plumes 71A, 71B, 71C (shown in FIG. 2). Second arm 90B and third arm 90C can rotate about $A_1$ together (i.e. one rotates into the page while the other rotates out of the page) or independently (i.e. they both rotate into the page or both rotate out of the page).

Arms 90A, 90B, 90C, one or more of which can be motorized, can be configured (e.g., with rakes 96) to manipulate at least one of workpiece holders 67A, 67B, 67C so as to expose different portions of workpieces 22A, 22B, 22C to vapor plumes (shown in FIG. 2) by energizing feedstock disposed in crucibles 72A, 72B, 72C. One or more baffles 80A, 80B, 80C, 80D can be secured to one or more arms 90A, 90B, 90C, and configured to partially or completely enclose workpieces within subchambers 82A, 82B, 82C in the desired coating zone(s) 76A, 76B, 76C.

For purposes of this disclosure, note that description of separate workpieces can encompass not only workpieces which are completely physically separate from one another (e.g., individual turbine blades or vanes), but also distinct sections of a single integrated workpiece. For example, an airfoil section and root section of a turbine blade or vane can be considered separate workpieces, as can first and second airfoils of a vane doublet.

One or more of baffles 80A, 80B, 80C, 80D can include one or more thermally reflective surfaces 92, which can allow for uniform heating of workpieces 22A, 22B, 22C. Thermal reflectivity and insulation can be further enhanced by making baffles 80A, 80B, 80C, 80D at least partially hollow, providing one or more thermal buffer spaces 94 between surfaces 92 to provide more consistent temperatures in each coating zone 76A, 76B, 76C.

FIG. 4 shows magazine 100 which is movable into and out of deposition chamber 18. Magazine 100 includes tray/rack 102 capable of retaining a plurality of crucibles 72 in a plurality of crucible receivers 104 at a plurality of coating positions. The material of crucible body 106 can be inert to the vaporization energy in that body 106 can provide thermal and electrical conduction to facilitate vapor formation from the feedstock material (not shown in FIG. 4) while remaining structurally intact and substantially phase stable during the coating process to prevent coating contamination. Crucibles 72 can also be configured with various means to prevent melting by the applied vaporization energy from one or more sources (e.g., sources 68A, 68B, 68C shown in FIG. 2. Such means include but are not limited to providing coolant passages through the crucible for circulating water or other cooling fluids therethrough.

Suitable non-limiting example materials for body 106 can include copper or an alloy thereof, as well as certain high-temperature ceramic materials. Recesses 108, defined by one or more walls 110 of each crucible 72 can be placed in line with the corresponding workpieces (e.g., workpieces 22A, 22B, 22C in workpiece holders 67A, 67B, 67C shown in FIGS. 2 and 3) so that a desired vapor plume can reach a respective workpiece.

Magazine 100 can also allow (e.g., via communication with control system 32, shown in FIG. 1) manual or automated positioning of crucibles 72 so that the resulting plumes (not shown) are in selective or constant communication with an appropriate coating zone(s) during a coating run. In certain embodiments, each crucible 72 can be provided with the same or different feedstock compositions, and can be arranged in such a way so as to allow multiple coating layers of different chemistries. By way of non-limiting example, one row of crucibles 72 in magazine 100 can be provided with ingots (shown in FIG. 2) of a first chemical composition and an adjacent row can be provided with ingots of a second, different composition. After one coating run involving one of the rows of crucibles 72, resulting in a first coating layer, magazine 100 can be repositioned so that another row of crucibles 72, containing feedstock ingots having the second composition, are exposed to the one or more workpieces for resulting in a second coating layer.

The circular crucibles and corresponding circular recesses 108 shown in FIG. 4 can result in a frustoconical vapor cloud, the dispersion of which can depend at least in part on the pressure in the deposition chamber during use. For example, deposition chamber pressure can be controlled by increasing or decreasing vacuum force through vacuum port 66 (shown in FIGS. 1 and 2). A comparison of FIGS. 5A-5C show this relationship between chamber pressure and dispersion of the vapor plume, when the crucible is maintained as a single geometry.

Figure 5A:
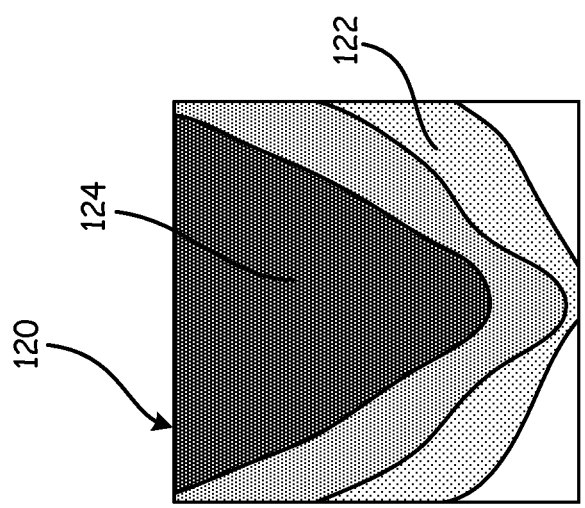
FIG. 5A shows an example vapor cloud shape at a first chamber pressure.

FIG. 5A is an illustration of a vapor plume 120 formed at a first deposition chamber pressure $P_1$, approaching 0 Pa (i.e., high vacuum). Plume 120 shows wide dispersal of the plume, and most of the coating vapor particles have high energy to facilitate coating, as shown in center 124. Around perimeter 122, however, energy of coating vapor particles is lower than in center 124 and can result in inconsistent surface deposition when in contact with particles in perimeter 122. High level of dispersion of vapor plume 120 can tend to overlap with adjacent plumes with multiple crucibles and feedstocks in a deposition chamber. When a workpiece or portion of a workpiece is in this overlapping zone, it can cause excess deposition on that portion of the workpiece resulting in nonuniform and unpredictable coating thickness.

Figure 5B:
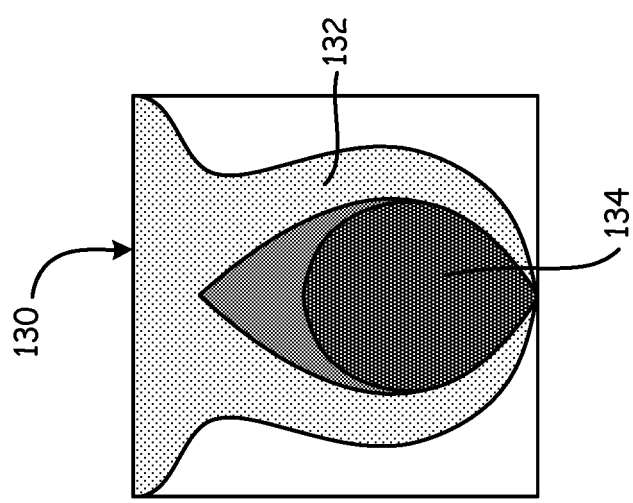
FIG. 5B shows an example vapor cloud shape at a second chamber pressure higher than the first chamber pressure.
Figure 5C:
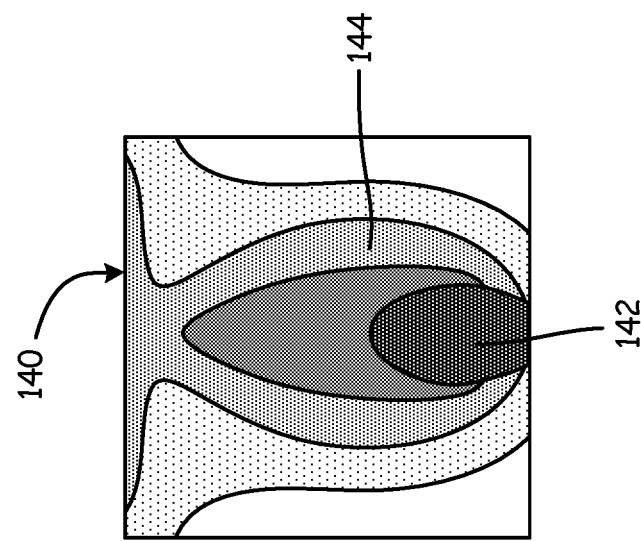
FIG. 5C shows an example vapor cloud shape at a third chamber pressure higher than the second chamber pressure.

FIG. 5B is an illustration of a vapor plume 130 formed at a second deposition chamber pressure $P_2$, which is higher than the first pressure $P_1$ (FIG. 5A). This can be induced, according to the apparatus in FIGS. 1 and 2, by reducing the vacuum at vacuum port 66. Here, the dispersal of plume 130 is reduced as compared to plume 120 in FIG. 5A, and center 134 of plume 130 is smaller than center 124 of plume 120. FIG. 5C is an illustration of a vapor plume 140 formed at a third deposition chamber pressure $P_3$, which is higher than second pressure $P_2$ (FIG. 5B), and thus resulting in a lower vacuum than in FIG. 5B. Here, the dispersal of plume 140 is reduced as compared to plume 120 in FIG. 5A and plume 130 in FIG. 5B. The geometries of the plumes 120, 130, 140 illustrate that deposition chamber pressure can be tailored to achieve desired dispersal of a particular vapor plume.

Even when deposition chamber pressure is increased to reduce overlap of adjacent vapor plumes, the higher concentration of vapor molecules increases the number and energy of collisions. Inventors have found that higher deposition chamber pressures appear to increase the likelihood that some fraction of these collisions result in larger molecules or clusters during transit to the workpiece. When such particles are allowed to deposit on the workpiece, coating microstructure can be disrupted, reducing coating quality. However, baffles 80 can further reduce interaction of coating plumes to reduce clustering, as well as provide radiative heat flux to the workpieces in order to maintain a desired temperature, both of which contribute to coating quality and consistency. Thus when combined with various crucible/feedstock shapes and/or the provision of tooling, substantially uniform deposition can be achieved, even in coating processes using multiple workpieces or more complex single workpieces with multiple coating areas (such as but not limited to airfoils and platforms of vane doublets and triplets).

Note that FIG. 4 shows a circular crucible shape which can result in a frustoconical vapor cloud (e.g., as shown in FIGS. 5A-5C). Alternate crucible shapes can accommodate both conventional circular feedstock, as well as differently shaped (e.g., non-circular) feedstock to provide vapor clouds more closely matching the shape of the workpiece(s) area to be coated so as to provide more uniform coating thickness, particularly under low vacuum conditions where energy of the generated vapor is reduced. Example configurations of these elements are described in more detail with respect to FIGS. 6A-6D and 7A-7B.

At least one of the crucibles in a magazine or in a deposition chamber can include a non-circular shape and/or a non-circular recess for retaining coating feedstock. As seen in these figures, the crucibles can be configured to retain a circular or a non-circular coating feedstock in the similarly circular or non-circular recesses. These non-circular crucibles, some of which also have non-circular recesses for retaining corresponding alternative feedstock ingots, are particularly but not exclusively suited for a low-vacuum coating process of multiple workpieces and/or complex workpieces with multiple distinct regions to be coated. They can also be used in conjunction with tooling secured to the workpiece fixtures and tailored to the shapes of the feedstock and workpieces involved.

Figure 6A:
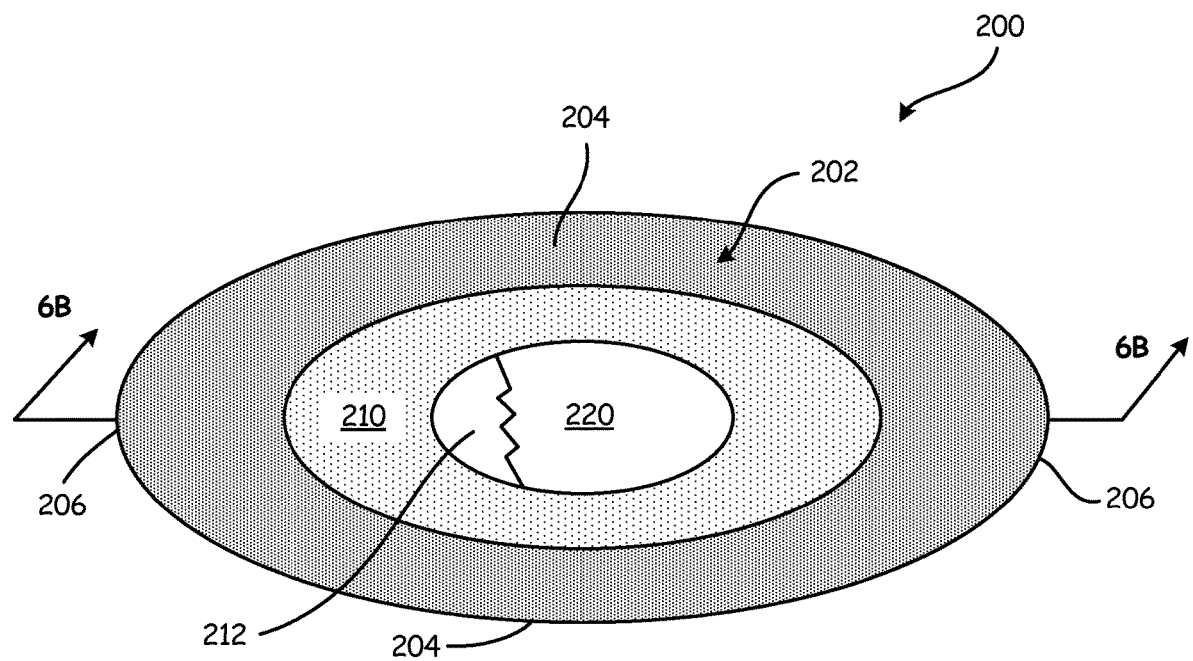
FIG. 6A is a top view of an alternative crucible having a single lower recess.
Figure 6B:
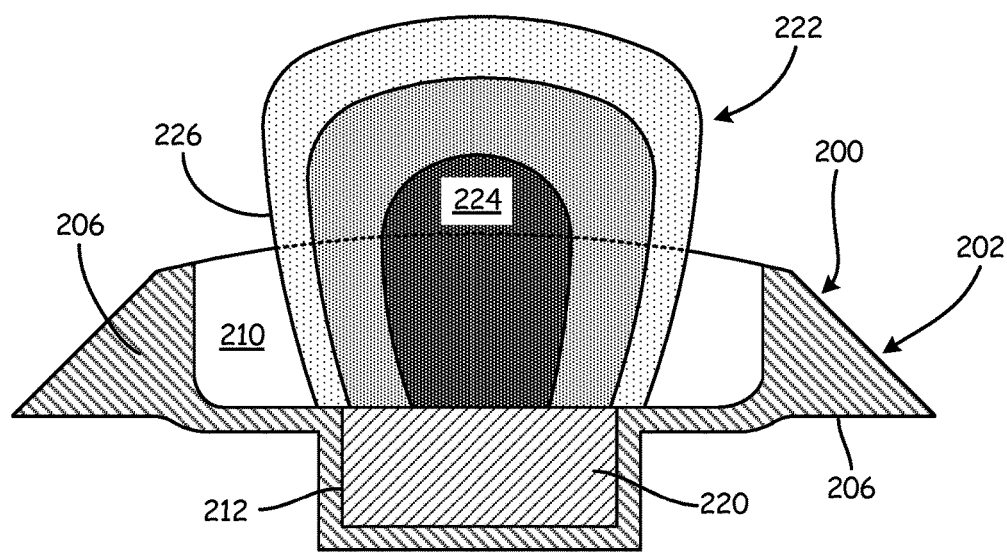
FIG. 6B is a side view of the alternative crucible shown in FIG. 6A.

FIG. 6A shows non-circular crucible 200 with a generally oval shape. Body 202 has elongated sidewalls 204 and curved end walls 206 defining upper recess 210 and lower recess 212 for retaining coating feedstock ingot 220 therein. When viewed from above into the recesses, upper recess 210 and lower recess 212 are of a generally non-circular oval shape. FIG. 6B is a sectional view of crucible 200, recesses 210, 212, circular feedstock ingot 220, and vapor plume 222 with center 224 and perimeter 226.

Oval feedstock ingot 220 is disposed in lower recess 212. A portion of feedstock ingot 220 is cut away in FIG. 6A to better show lower recess 212. The elongated oval shape of upper recess 210 can further change the geometry of a formed vapor plume (e.g., plume 222) to more closely conform to differently shaped workpieces (not shown). This can be used in conjunction with deposition processes utilizing higher chamber pressures to reduce dispersion of vapor plume 222 (omitted from FIG. 6A for clarity) away from crucible 200, confining it to a desired coating zone. In use, the chamber pressure and energy can be selected so that plume center 224 focuses primarily on a particular workpiece or portion thereof. Perimeter 226 can be further confined via tooling around one or more workpieces, such as in the examples shown in FIGS. 2 and 3.

Figure 6C:
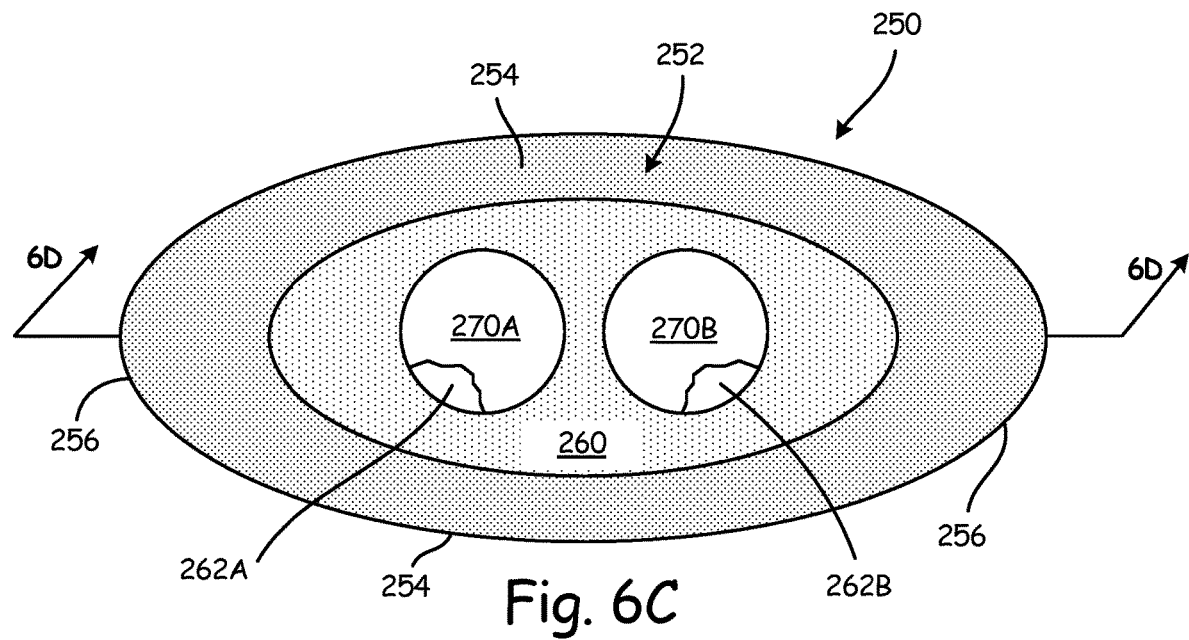
FIG. 6C is a top view of an alternative crucible with multiple lower recesses.
Figure 6D:
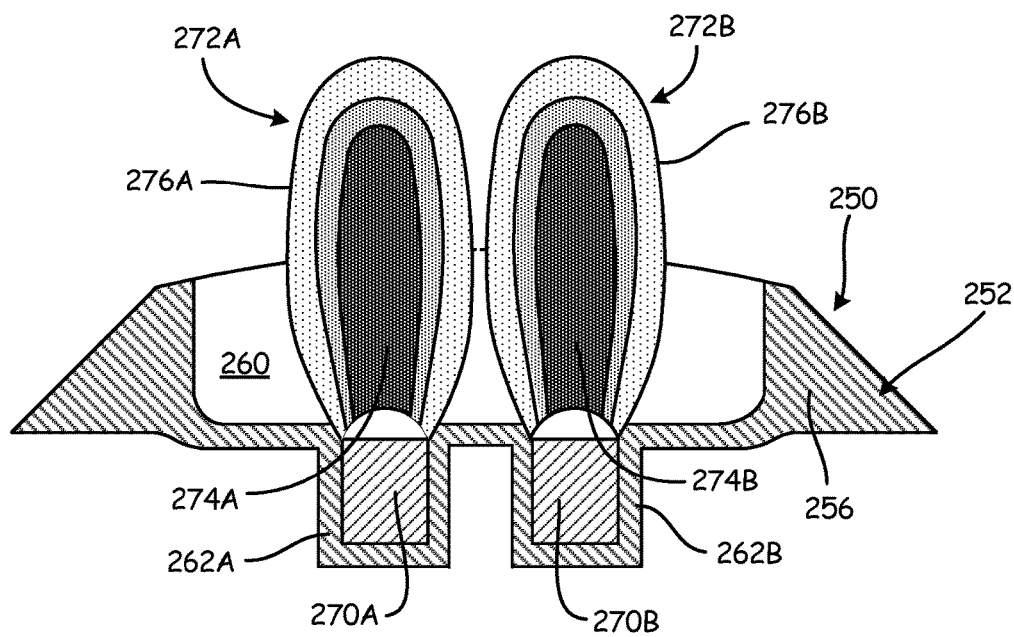
FIG. 6D is a side view of the alternative crucible shown in FIG. 6C.

FIG. 6C shows non-circular crucible 250 with a generally oval shape similar to crucible 200. Body 252 has elongated sidewalls 254 and curved end walls 256 defining upper recess 260 in an oval shape (when viewed from above into recess 260). Here, there are two circular lower recesses 262A, 262B for retaining two coating feedstock ingots therein. Portions of feedstock ingots 270A, 270B are cut away in FIG. 6C to better show lower recesses 262A, 262B. FIG. 6D is a sectional view of non-circular crucible 250, recesses 260, 262A, 262B, feedstock ingots 270A, 270B, and vapor plumes 272A, 272B with respective centers 274A, 274B, and respective perimeters 276A, 276B.

In certain embodiments, one of feedstock ingots 270A, 270B can be supplemental or complementary to the other. In certain of these embodiments, feedstock ingot 270A can have a different material composition as compared to circular feedstock ingot 270B, which result in different vapor compositions. This is represented by different sizes of plumes 272A, 272B.

In use, the chamber pressure and energy can be selected so that plume centers 274A, 274B focus primarily on particular portion(s) of a workpiece. Plume perimeters 276A, 276B can be further confined via tooling around one or more workpieces, such as in the examples shown in FIGS. 2 and 3. Alternatively, chamber pressure and energy can be varied so that plumes 272A, 272B can overlap during some or all of a particular coating run. This variation can be used, for example, in situations where two different solid feedstocks are desired for codeposition.

Figure 7A:
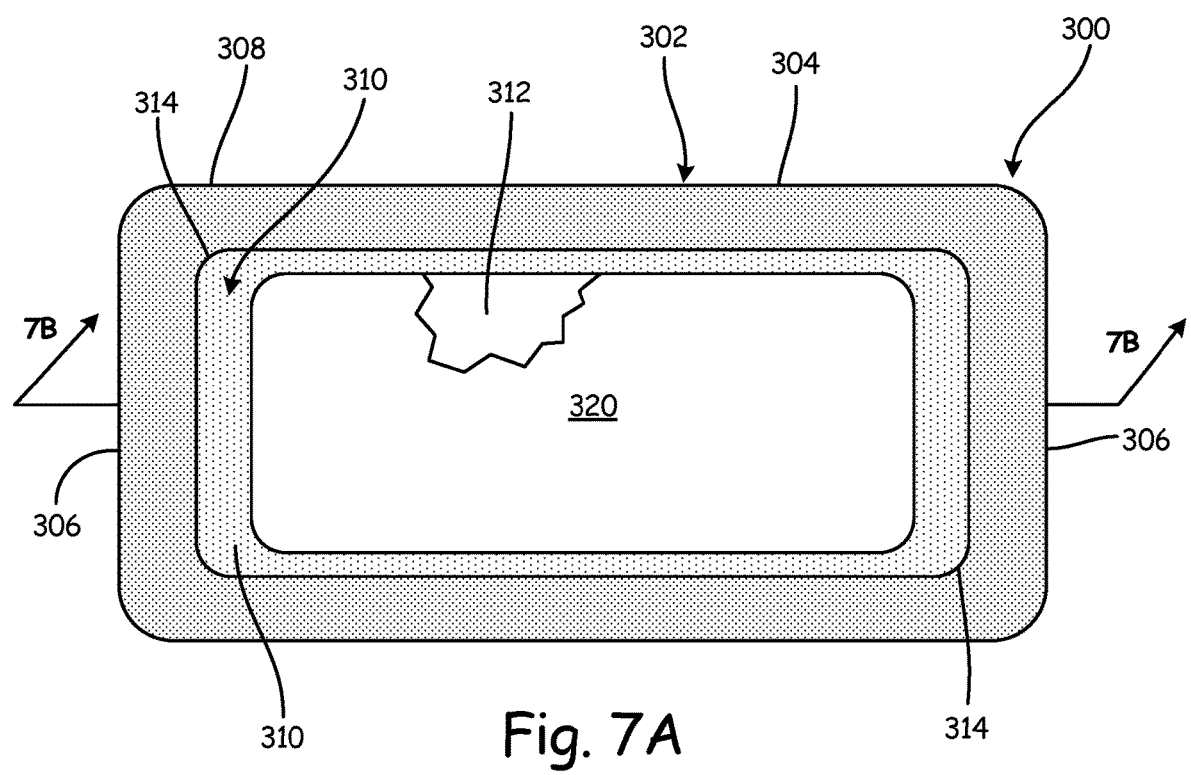
FIG. 7A is a top view of an alternative crucible having an enlarged lower recess.
Figure 7B:
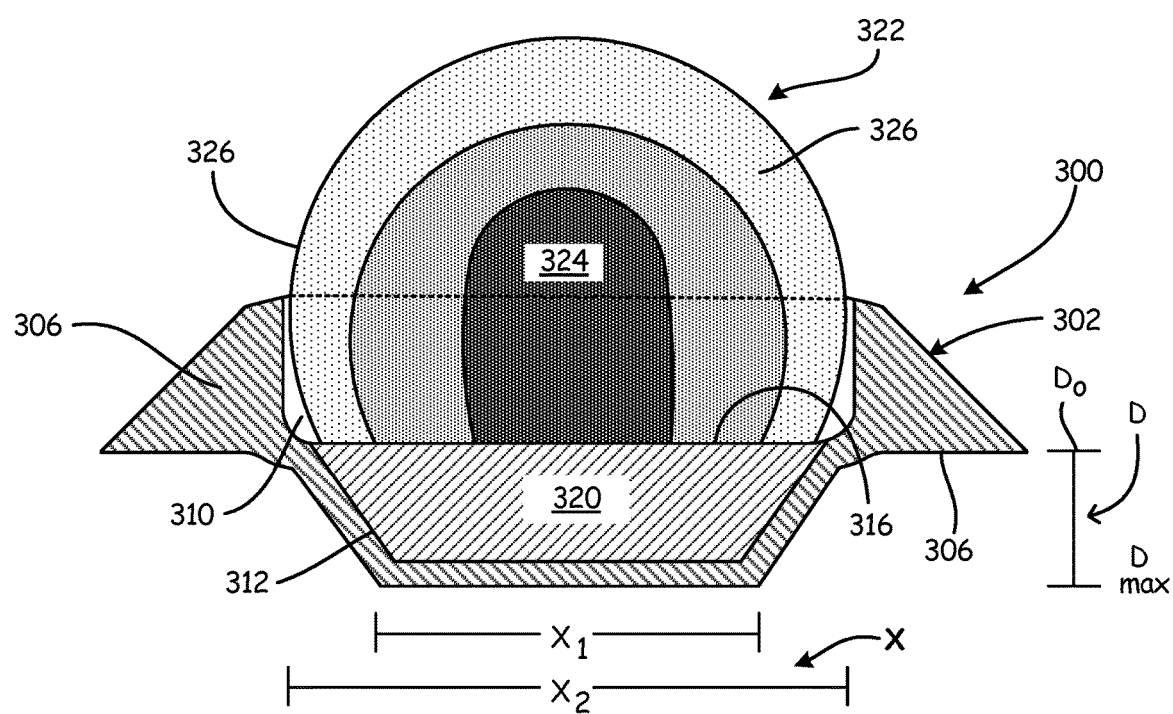
FIG. 7B is a side view of the alternative crucible shown in FIG. 7A.

FIG. 7A shows non-circular crucible 300 with generally rectangular body 302 having two generally straight elongated sidewalls 304, and two shorter straight end walls 306 defining upper recess 310 and tapered lower recess 312 for retaining coating feedstock therein. A portion of feedstock ingot 320 is cut away in FIG. 7A to better show lower recess 312. FIG. 7B is a sectional view of non-circular crucible 300, recesses 310, 312, tapered racetrack feedstock ingot 320, and vapor plume 322 (omitted from FIG. 7A for clarity).

Upper recess 310 can include one or more rounded internal corners 314 to modify a generally rectangular shape of upper recess 310 (when viewed from above). This results in what is sometimes known colloquially as a "racetrack" shape. This in turn can potentially improve uniformity of vapor plume 322 around its edges by reducing discontinuities possibly resulting from sharp internal corners. In this example, body 302 also can include one or more optionally rounded external corners 308 to maintain substantially constant wall thickness for uniform heating, as well as to potentially simplify manufacture of a crucible (e.g., crucible 300).

The non-circular lower recess 312 (rectangular with rounded corners) can include one or more cross-sectional dimensions X, and in turn, a cross-sectional area, varying with a depth D of lower recess 312 below base 316 of upper recess 310. FIG. 7B shows cross-sectional dimension $X_1$, where depth D approaches 0, and cross-sectional dimension $X_2$ where depth D approaches $D_{max}$ below base 316 of upper recess 310. As depth D increases below upper crucible surface 316 (i.e., as depth D increases from 0 to $D_{max}$), the result is that dimension X can decrease such that dimension $X_2$ is smaller than dimension $X_1$.

Varying the cross-sectional dimension(s) of lower recess 312 can accommodate tapered feedstock ingot 320, where the desired vapor concentration can be reduced as coating progresses through consumption of the feedstock. This can be done to reduce or eliminate the need to reduce the applied vaporization energy as a means to control the vapor concentration in plume 322. Since higher operating pressures (less applied vacuum) in the deposition chamber can reduce the available energy of the vapor plume, the applied vaporization energy can be kept more or less constant throughout the process, improving accuracy of the coating process. In use, the chamber pressure and energy can be selected so that plume center 324 focuses primarily on a particular workpiece or portion thereof. Perimeter 326 can be further confined via tooling around one or more workpieces, such as in the examples shown in FIGS. 2 and 3.

In additional embodiments, adding curves or edges to elongated sidewalls 304 and/or end walls 306 can result in an elongated irregular shape of body 302 to further accommodate irregularly shaped recesses while ensuring substantially constant wall thickness.

Discussion of Possible Embodiments

An embodiment of an apparatus includes a first crucible in communication with a deposition chamber, an energy source, and a workpiece fixture. The first crucible includes a plurality of walls defining an upper recess and a first lower recess, at least the upper recess open to an interior of the deposition chamber. The energy source is configured to selectively apply and direct energy within the deposition chamber, including toward the first crucible. The workpiece fixture includes tooling and a plurality of workpiece holders configured to retain at least one workpiece selectively within the deposition chamber. The tooling includes at least one wall separating at least a first of the plurality of workpiece holders from a second of the plurality of workpiece holders.

The following are non-exclusive descriptions of possible embodiments of the present invention.

An apparatus according to an exemplary embodiment of this disclosure, among other possible things includes a deposition chamber; a first crucible including a plurality of walls defining an upper recess and a first lower recess, at least the upper recess open to an interior of the deposition chamber; an energy source configured to selectively apply and direct energy within the deposition chamber, including toward the first crucible; and a workpiece fixture comprising: a plurality of workpiece holders configured to retain at least one workpiece selectively within the deposition chamber; and tooling including at least one wall separating at least a first of the plurality of workpiece holders from a second of the plurality of workpiece holders.

The apparatus of the preceding paragraph can optionally include, additionally and/or alternatively, any one or more of the following features, configurations and/or additional components:

A further embodiment of the foregoing apparatus, wherein the plurality of workpiece holders includes: a first workpiece holder configured to retain a first workpiece in a first coating zone in the deposition chamber; and a second workpiece holder configured to retain a second workpiece in a second coating zone in the deposition chamber; wherein the at least one wall separates the first workpiece holder and the second workpiece holder.

A further embodiment of any of the foregoing apparatus, further comprising a second crucible; wherein the first crucible is in communication with the first coating zone, and the second crucible is in communication with the second coating zone.

A further embodiment of any of the foregoing apparatus, wherein the workpiece fixture further comprises: a first arm configured to manipulate at least one of the plurality of workpiece holders about a first longitudinal axis.

A further embodiment of any of the foregoing apparatus, wherein the workpiece fixture further comprises: a triaxial shaft supporting the plurality of workpiece holders, the triaxial shaft including at least the first arm.

A further embodiment of any of the foregoing apparatus, wherein ones of the plurality of workpiece holders are secured to a plurality of rakes connected to the triaxial shaft, and the triaxial shaft is configured to drive rotation of the rakes, and in turn, rotation of the plurality of workpiece holders about at least the first longitudinal axis.

A further embodiment of any of the foregoing apparatus, wherein the triaxial shaft is configured to drive rotation of the rakes about at least the first longitudinal axis so as to expose different portions of each of the plurality of workpieces to a plurality of vapor plumes generated from energy directed to coating feedstock disposed in the deposition chamber.

A further embodiment of any of the foregoing apparatus, and further comprising: a magazine positionable within deposition chamber, wherein the magazine retains a plurality of crucibles including the first crucible.

A further embodiment of any of the foregoing apparatus, wherein the magazine is positioned in the deposition chamber such that at least the upper recess of the first crucible is in line with the first workpiece holder.

A further embodiment of any of the foregoing apparatus, wherein the at least one wall includes a plurality of baffle walls defining at least a portion of a first coating subchamber and a second coating subchamber.

A further embodiment of any of the foregoing apparatus, wherein the at least one wall includes a wall with a first thermally reflective surface facing the first workpiece holder, and a second thermally reflective surface facing the second workpiece holder.

A further embodiment of any of the foregoing apparatus, wherein the first thermally reflective surface is spaced apart from the second thermally reflective surface, defining a thermal buffer space therebetween.

An embodiment of a workpiece fixture for a vapor deposition apparatus includes tooling and a plurality of workpiece holders configured to retain at least one workpiece selectively within a deposition chamber. The tooling includes at least one wall separating at least a first of the plurality of workpiece holders from a second of the plurality of workpiece holders.

A workpiece fixture according to an exemplary embodiment of this disclosure, among other possible things includes a plurality of workpiece holders configured to retain at least one workpiece selectively within a vapor deposition chamber; and tooling including at least one wall separating at least a first of the plurality of workpiece holders from a second of the plurality of workpiece holders.

The apparatus of the preceding paragraph can optionally include, additionally and/or alternatively, any one or more of the following features, configurations and/or additional components:

A further embodiment of the foregoing workpiece fixture, wherein the plurality of workpiece holders comprises: a first workpiece holder configured to retain a first workpiece in a first coating zone in the deposition chamber; and a second workpiece holder configured to retain a second workpiece in a second coating zone in the deposition chamber; wherein the at least one wall separates the first workpiece holder and the second workpiece holder.

A further embodiment of any of the foregoing workpiece fixtures, and further comprising: a first arm configured to manipulate at least one of the plurality of workpiece holders about a first longitudinal axis.

A further embodiment of any of the foregoing workpiece fixtures, and further comprising: a triaxial shaft supporting a plurality of workpiece holders, the triaxial shaft including at least the first arm.

A further embodiment of any of the foregoing workpiece fixtures, wherein ones of the plurality of workpiece holders are secured to a plurality of rakes connected to the triaxial shaft, and the triaxial shaft is configured to drive rotation of the rakes, and in turn, rotation of the plurality of workpiece holders about at least the first longitudinal axis.

A further embodiment of any of the foregoing workpiece fixtures, wherein the at least one wall includes a plurality of baffle walls defining at least a portion of a first coating subchamber and at least a portion of a second coating subchamber.

A further embodiment of any of the foregoing workpiece fixtures, wherein the at least one wall includes a wall with a first thermally reflective surface facing the first workpiece holder, and a second thermally reflective surface facing the second workpiece holder.

A further embodiment of any of the foregoing workpiece fixtures, wherein the first thermally reflective surface is spaced apart from the second thermally reflective surface, defining a thermal buffer space therebetween.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method comprising:
   retaining a first workpiece and at least a second workpiece selectively on a workpiece fixture disposed within a deposition chamber, the workpiece fixture comprising tooling including a first workpiece holder, at least a second workpiece holder, and at least a first hollow wall disposed between the first and second workpieces and at least second workpiece holders, having at least one internal thermal buffer space;
   separating the first workpiece from the second workpiece using at least the first hollow wall to define a first coating zone around the first workpiece and at least a second coating zone around the at least second workpiece;
   controlling a main gas valve with an inlet port terminating at a wall of the chamber to maintain a substantially uniform partial vacuum pressure of greater than 2 Pa throughout the chamber;
   while maintaining the partial vacuum, selectively applying and directing energy toward a first crucible and at least a second crucible within the deposition chamber, the first and second crucible each having an upper recess contiguous with, and disposed directly above at least a first lower recess, at least each upper recess having a non-round cross-section open to an interior of the deposition chamber such that when a feedstock disposed in at least each upper recess is vaporized by the applied energy, first and at least second vapor plumes form around the first and at least second workpieces in the corresponding first and at least second coating zones; and
   wherein a particular value of the partial vacuum pressure in the deposition chamber is adjusted during coating to control a size and confine the first and at least the second vapor plumes around each of the at least one corresponding workpiece;
   wherein the particular value of the partial vacuum pressure, in conjunction with a size and shape of the walls around the workpieces, minimizes overlap of adjacent ones of the vapor plumes formed above the crucibles.

2. The method of claim 1, and further comprising:
   positioning a magazine within the deposition chamber, wherein the magazine retains a plurality of crucibles including the first crucible and at least the second crucible.

3. The method of claim 2, wherein the positioning step comprises positioning the magazine in the deposition chamber such that at least the upper recess of the first crucible is in a line of sight with the first workpiece holder.

4. The method of claim 1, further comprising:
   manipulating at least one of the plurality of workpiece holders about a first longitudinal axis.

5. The method of claim 4, wherein the manipulating step is performed by the workpiece fixture, which further comprises a triaxial shaft supporting the plurality of workpiece holders, the triaxial shaft including at least a first arm.

6. The method of claim 5, wherein ones of the plurality of workpiece holders are secured to a plurality of rakes connected to the triaxial shaft, and the triaxial shaft is configured to drive rotation of the rakes, and in turn, rotation of the plurality of workpiece holders about at least the first longitudinal axis.

7. The method of claim 6, wherein the triaxial shaft is configured to drive rotation of the rakes about at least the first longitudinal axis so as to expose different portions of each of the plurality of workpieces to a plurality of vapor plumes generated from energy directed to coating feedstock disposed in the deposition chamber.

8. The method of claim 1, wherein the at least one wall includes a plurality of baffle walls defining at least a portion of a first coating subchamber and a second coating subchamber.

9. The method of claim 1, wherein the at least one wall includes a wall with a first thermally reflective surface facing the first workpiece holder, and a second thermally reflective surface facing the second workpiece holder.

* * * * *